(12) United States Patent
Tran et al.

(10) Patent No.: US 6,541,792 B1
(45) Date of Patent: Apr. 1, 2003

(54) MEMORY DEVICE HAVING DUAL TUNNEL JUNCTION MEMORY CELLS

(75) Inventors: Lung T. Tran, Saratoga, CA (US); Heon Lee, Sunnyvale, CA (US)

(73) Assignee: Hewlett-Packard Development Company, LLP, Houston, TX (US)

( * ) Notice: Subject to any disclaimer, the term of this patent is extended or adjusted under 35 U.S.C. 154(b) by 0 days.

(21) Appl. No.: 09/951,378

(22) Filed: Sep. 14, 2001

(51) Int. Cl.[7] .............................................. H01L 29/04
(52) U.S. Cl. ...................... 257/50; 257/106; 257/530; 257/598; 438/257; 365/230.07; 365/171
(58) Field of Search ......................... 257/50, 103, 530, 257/598; 438/131, 257, 600; 365/230.07, 33, 65, 66, 158, 171.33, 173, 235

(56) References Cited

U.S. PATENT DOCUMENTS

| | | | |
|---|---|---|---|
| 5,096,846 A | * | 3/1992 | Randall ........................ 438/172 |
| 5,374,832 A | * | 12/1994 | Tung et al. .................... 257/50 |
| 5,640,343 A | | 6/1997 | Gallagher et al. |
| 5,701,222 A | | 12/1997 | Gill et al. |
| 5,793,697 A | * | 8/1998 | Scheuerlein ........... 365/230.07 |
| 5,991,193 A | | 11/1999 | Gallagher et al. |
| 6,104,632 A | | 8/2000 | Nishimura |
| 6,169,686 B1 | | 1/2001 | Brug et al. .................. 365/171 |
| 6,185,122 B1 | | 2/2001 | Johnson et al. ............. 365/103 |
| 6,259,644 B1 | | 7/2001 | Tran et al. ................... 365/209 |
| 6,269,018 B1 | | 7/2001 | Monsma et al. |
| 6,271,088 B1 | * | 8/2001 | Liu et al. ..................... 438/259 |
| 6,331,944 B1 | | 12/2001 | Monsma et al. |
| 6,351,406 B1 | | 2/2002 | Johnson et al. |

* cited by examiner

*Primary Examiner*—David Nelms
*Assistant Examiner*—Long Tran

(57) ABSTRACT

A memory device includes memory cells having two tunnel junctions in series. In order to program a selected memory cell, a first tunnel junction in the selected memory cell is blown. Blowing the first tunnel junction creates a short across the first tunnel junction, and changes the resistance of the selected memory cell from a first state to a second state. The change in resistance is detectable by a read process. The second tunnel junction has different anti-fuse characteristic than the first tunnel junction, and is not shorted by the write process. The second tunnel junction can therefore provide an isolation function to the memory cell after the first tunnel junction is blown.

19 Claims, 10 Drawing Sheets

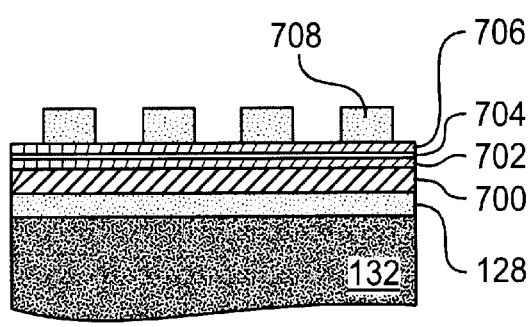
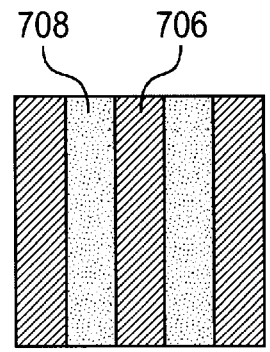
FIG. 9A  FIG. 9B
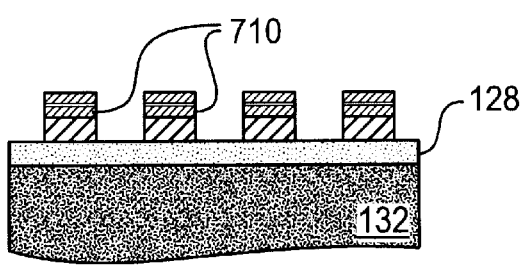
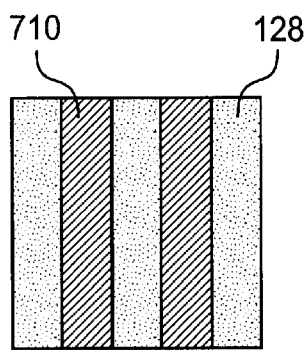
FIG. 10A  FIG. 10B
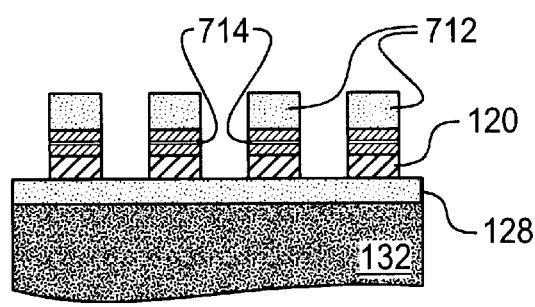
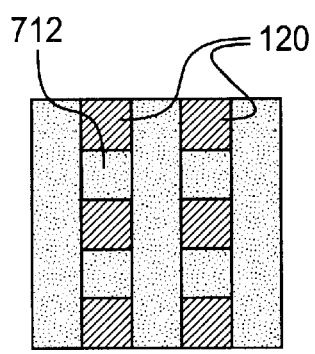
FIG. 11A  FIG. 11B

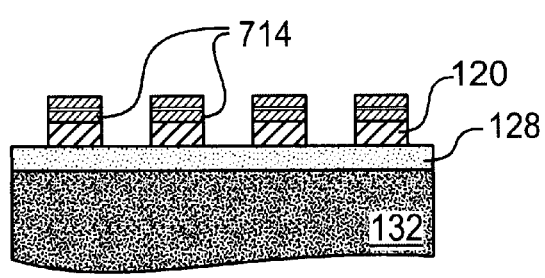
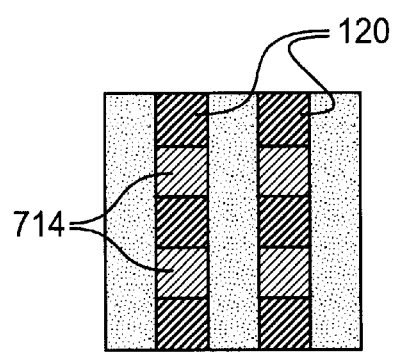
FIG. 12A  FIG. 12B
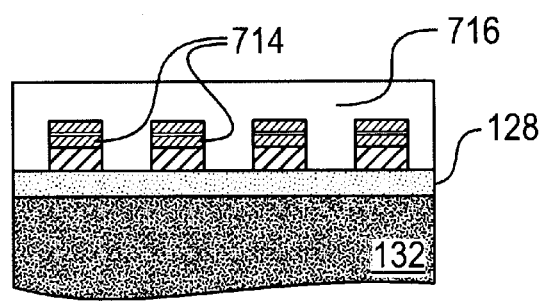
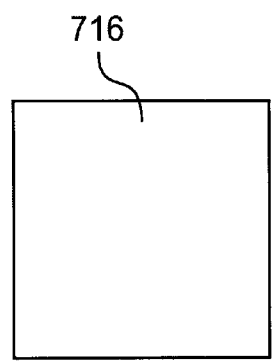
FIG. 13A  FIG. 13B
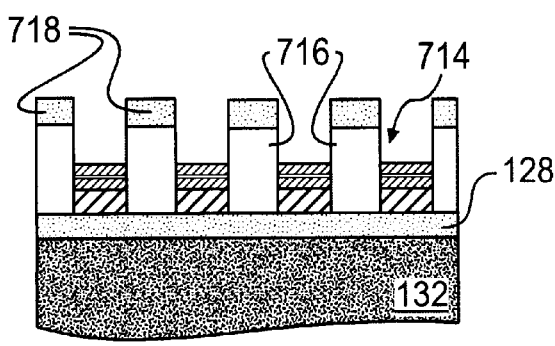
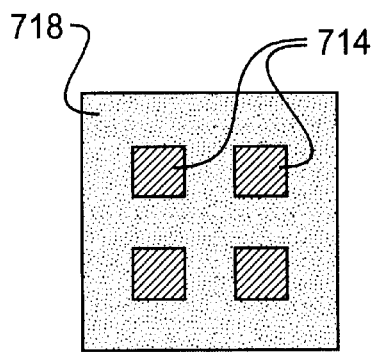
FIG. 14A  FIG. 14B

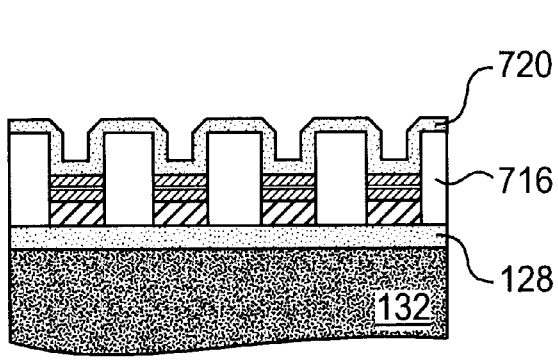
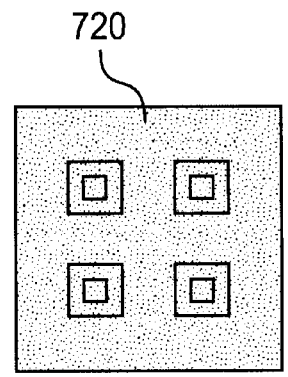
FIG. 15A  FIG. 15B
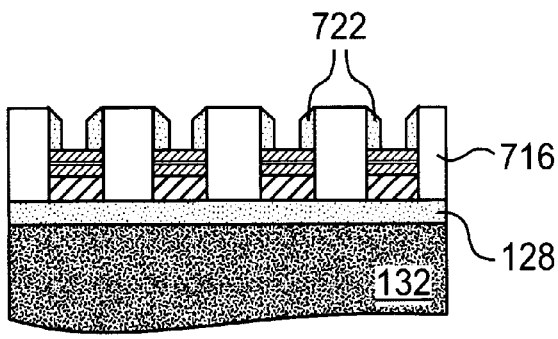
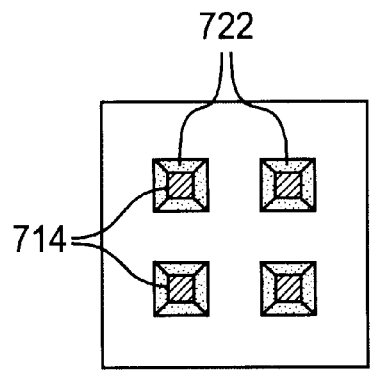
FIG. 16A  FIG. 16B
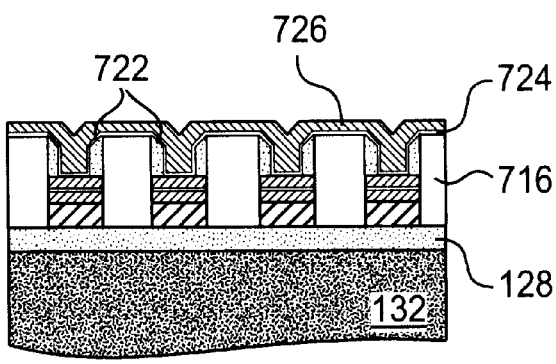
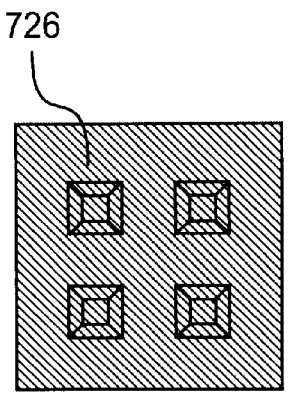
FIG. 17A  FIG. 17B

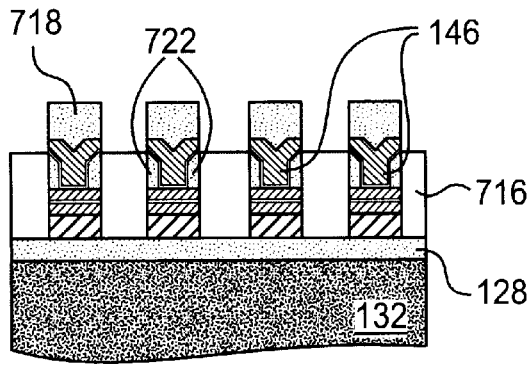 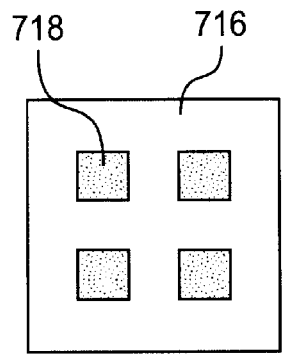
FIG. 18A  FIG. 18B
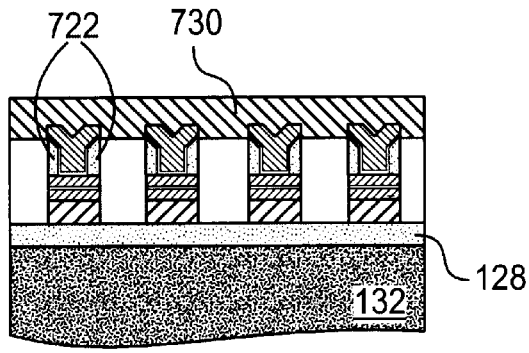 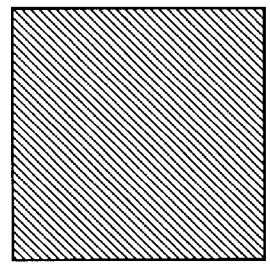
FIG. 19A  FIG. 19B
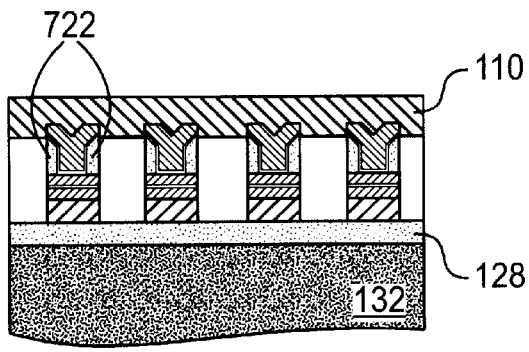 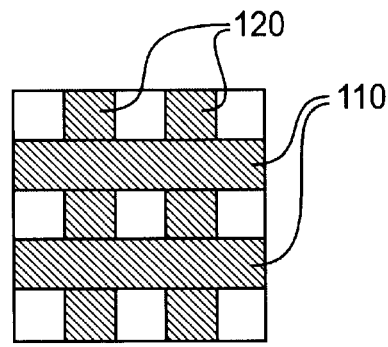
FIG. 20A  FIG. 20B

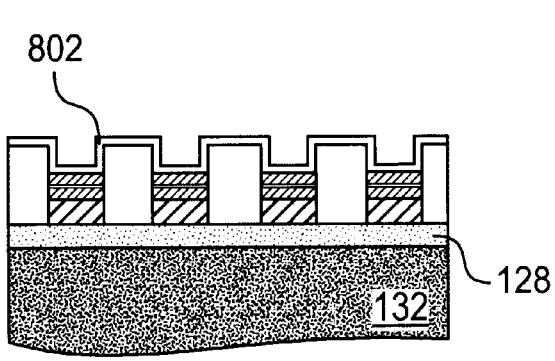
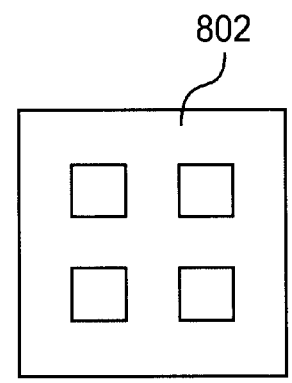
FIG. 21A  FIG. 21B
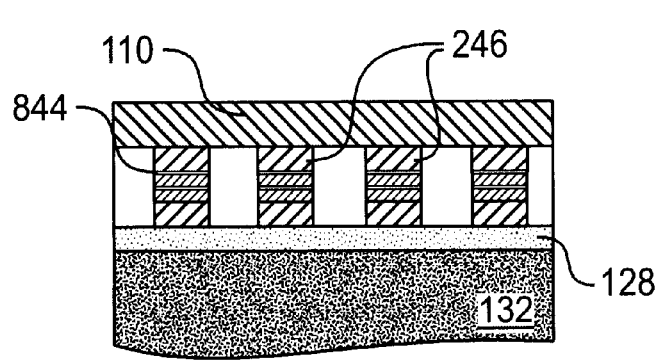
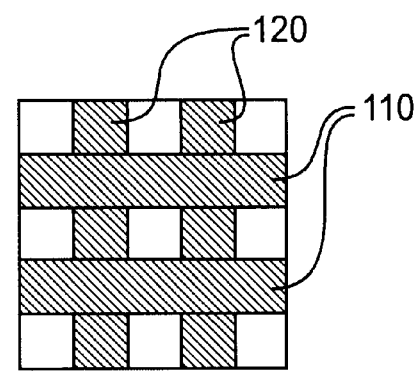
FIG. 22A  FIG. 22B

MEMORY DEVICE HAVING DUAL TUNNEL JUNCTION MEMORY CELLS

TECHNICAL FIELD

The technical field is memory devices for storing data. More particularly, the technical field is memory devices having memory cells with tunnel junctions in series.

BACKGROUND

Memory devices are utilized in consumer electronic products to store data such as instructions utilized by the products. Nonvolatile memory devices are desirable because they do not require power to retain data. Therefore, data stored in nonvolatile memory devices is preserved when a power supply is exhausted or disconnected from the memory device. Consumers also prefer products of small volume and low cost, and the requirements of non-volatility, high density, and low cost are primary driving factors in the design of memory devices. Low power consumption is also desirable because smaller power sources can be used, reducing the size of consumer electronic products.

Nonvolatile memory devices typically have one time programmable (OTP) or re-programmable memory cells. A re-programmable memory cell can be switched among binary states. An OTP memory cell's state is permanent once the cell is programmed. OTP memory devices can generally be classified as one of fuse, anti-fuse, charge storage, or mask read only memory (mask ROM).

A fuse memory cell is programmed by applying a large voltage across the cell so that the cell is "blown" during programming. The binary state of fuse memory cells can be detected as the resistance across the cell measured during a read process. Fuse memory devices are unpopular because of the large current required to program fuse memory cells. The large programming current requires a high voltage power supply having large drive transistors, or a charge pump circuit. Fuse memory cells also occupy a large area of the substrate because of contact regions required for each fuse element. The large cell size decreases array density and increases the size of fuse memory devices.

Fuse memory cells often include an isolation element such as a diode or transistor, which further increases cell size. Isolation diodes and transistors used in fuse memory cells have limited current capability, and may be damaged by the large write currents required to program the memory cells. In addition, the isolation diodes and transistors are typically active silicon-based elements, which are most readily formed on a silicon crystal substrate. Isolation elements of this type preclude stacking of multiple layers of fuse OTP arrays, decreasing possible array density. Other silicon-based isolation elements such as micro-crystalline and amorphous diodes and transistors enable stacking, but increase complexity and cost of fabrication. Finally, fuse memory cells are characterized by a wide breakdown threshold distribution. A wide breakdown threshold distribution means a large variation in write current may be required to program a cell. The write current must typically be increased to account for the wide breakdown threshold distribution.

Conventional anti-fuse memory cells typically include a metal-dielectric-metal stack. Conventional anti-fuse memory cells are programmed by applying a large write potential across the cells. The write potential triggers the anti-fuse and reduces the resistance across a programmed memory cell. Conventional anti-fuse memory cells suffer many of the same disadvantages as fuse/transistor cells. For example, conventional anti-fuse memory cells require a large write potential, and may require active silicon-based isolation elements.

A common charge storage memory is EPROM. EPROM memory utilizes Fowler-Nordheim tunneling to transfer charge from a substrate to a floating gate in the memory cell. EPROM memories require a large write voltage, and the write speed in EPROM devices is limited by tunneling current density.

Mask ROM memories are programmed at the time of fabrication, rather than at the user level ("field programming"). Therefore, each batch of mask ROM devices is application-specific. As in most manufacturing processes, cost savings are realized with increased volume. Therefore, in order for mask ROM production to be cost-effective, there must be a large demand for an application-specific memory. The requirement for large-scale processing renders mask ROM too costly for many applications.

A need therefore exists for a low cost memory device having memory cells capable of high density arrangement. A need also exists for a memory device capable of high speed processing and that does not require excessive processing power.

SUMMARY

According to a first aspect, a memory device includes dual tunnel junction memory cells having a first tunnel junction and a second tunnel junction in series with the first tunnel junction. The first tunnel junction may be changed from a first resistance state to a second resistance state. The memory cells are the data storage elements for the memory device, and the two resistance states represent binary states of the memory cells. The first and second tunnel junctions have differing anti-fuse characteristics, and the memory cells can be programmed so that the first tunnel junction is shorted while the second tunnel junction resistance remains substantially unchanged.

According to the first aspect, if the first tunnel junction is shorted, the second tunnel junction provides an isolation function for the programmed memory cell. Therefore, active silicon-based isolation diodes and/or transistors are not required to isolate the memory cells in the memory device. The memory device can therefore include stacked memory elements, increasing array density.

Also according to the first aspect, the tunnel junction memory cells are smaller than conventional memory cells having diode/transistor isolation elements. This aspect further increases array density. The absence of diode/transistor isolation elements also simplifies the manufacture of the memory device.

According to a second aspect, a selected memory cell can be programmed by applying a write current to the memory cell. The resistance of the first tunnel junction can be higher than the resistance of the second tunnel junction, so that a higher voltage is created across the first tunnel junction when the write current is applied.

According to the second aspect, the higher voltage across the first tunnel junction can exceed a breakdown voltage of the first tunnel junction, and can be used to program the selected cell. The resistance of the first tunnel junction can be increased by reducing a tunneling area of the first tunnel junction, which advantageously reduces the possible area for defects in the dielectric. The reduction in possible defects reduces the voltage/current programming distribution (breakdown threshold distribution) of the memory device, which in turn reduces the power requirements for the memory device.

According to a third aspect of the invention, the dual tunnel junction memory cells can be programmed by applying a write voltage that exceeds a breakdown voltage of the first tunnel junction. The breakdown voltage of the first tunnel junction can be determined by the thickness of and the material used to form a dielectric in the first tunnel junction.

According to the third aspect, the programming voltage of the tunnel junction can be reduced by reducing the breakdown voltage of the dielectric layer. The programming voltage can therefore be lower than in conventional anti-fuse devices. A low programming voltage allows for smaller, low power write circuitry in the memory device.

According to a fourth aspect, the breakdown threshold distribution of the first tunnel junction can be reduced by providing a dielectric for the first tunnel junction having nonuniform thickness. The nonuniform thickness can be established by forming a feature in the dielectric, where tunneling occurs at the feature during a write process.

According to the fourth aspect, the feature can be an area of reduced thickness in the dielectric, which reduces the breakdown voltage of the first tunnel junction. The feature also provides a relatively small tunneling area for the first tunnel junction, reducing the breakdown threshold distribution of the memory device.

Other aspects and advantages will become apparent from the following detailed description, taken in conjunction with the accompanying drawings.

DESCRIPTION OF THE DRAWINGS

The detailed description will refer to the following drawings, in which like numerals refer to like elements, and in which:

FIGS. 9–20 illustrate a method of making the memory array illustrated in FIG. 1; and FIGS. 21–22 illustrate an alternative method of making the memory array illustrated in FIG. 1.

DETAILED DESCRIPTION

A memory device having dual tunnel junction memory cells will be discussed by way of preferred embodiments and by way of the drawings.

Figure 1:
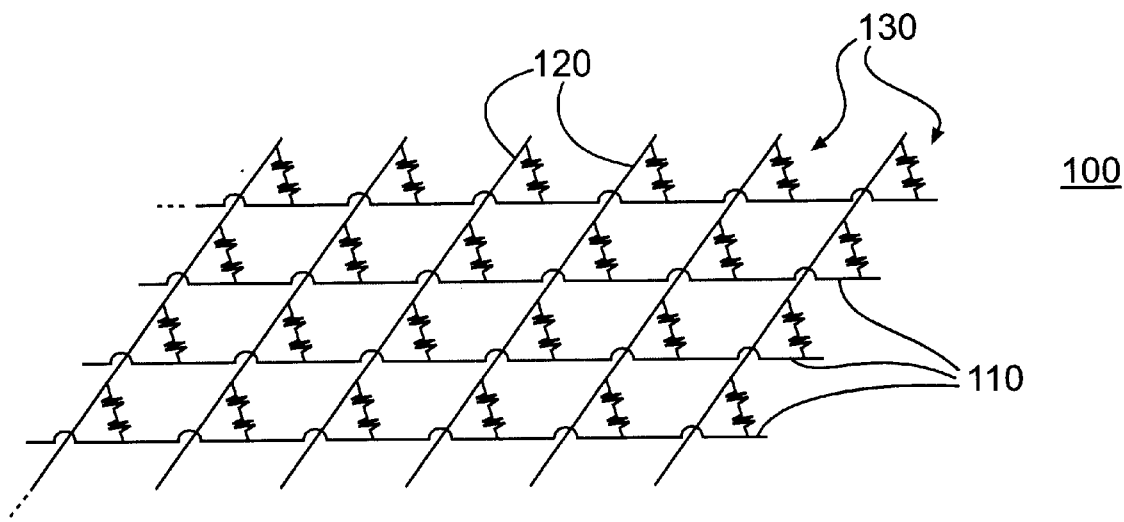
FIG. 1 is a schematic perspective view of a memory array having dual tunnel junction memory cells.

FIG. 1 is a schematic perspective view of a memory array 100 having dual tunnel junction memory cells 130. In the memory array 100, word lines 110 extend in horizontal rows, and bit lines 120 extend in vertical columns. The word lines 110 cross the bit lines 120 at memory cells 130. Each memory cell 130 can store a binary state of either "1" or "0." In FIG. 1, the dual tunnel junction memory cells 130 are illustrated symbolically as two resistive elements. Each resistive element corresponds to a tunnel junction in a memory cell 130.

Figure 2:
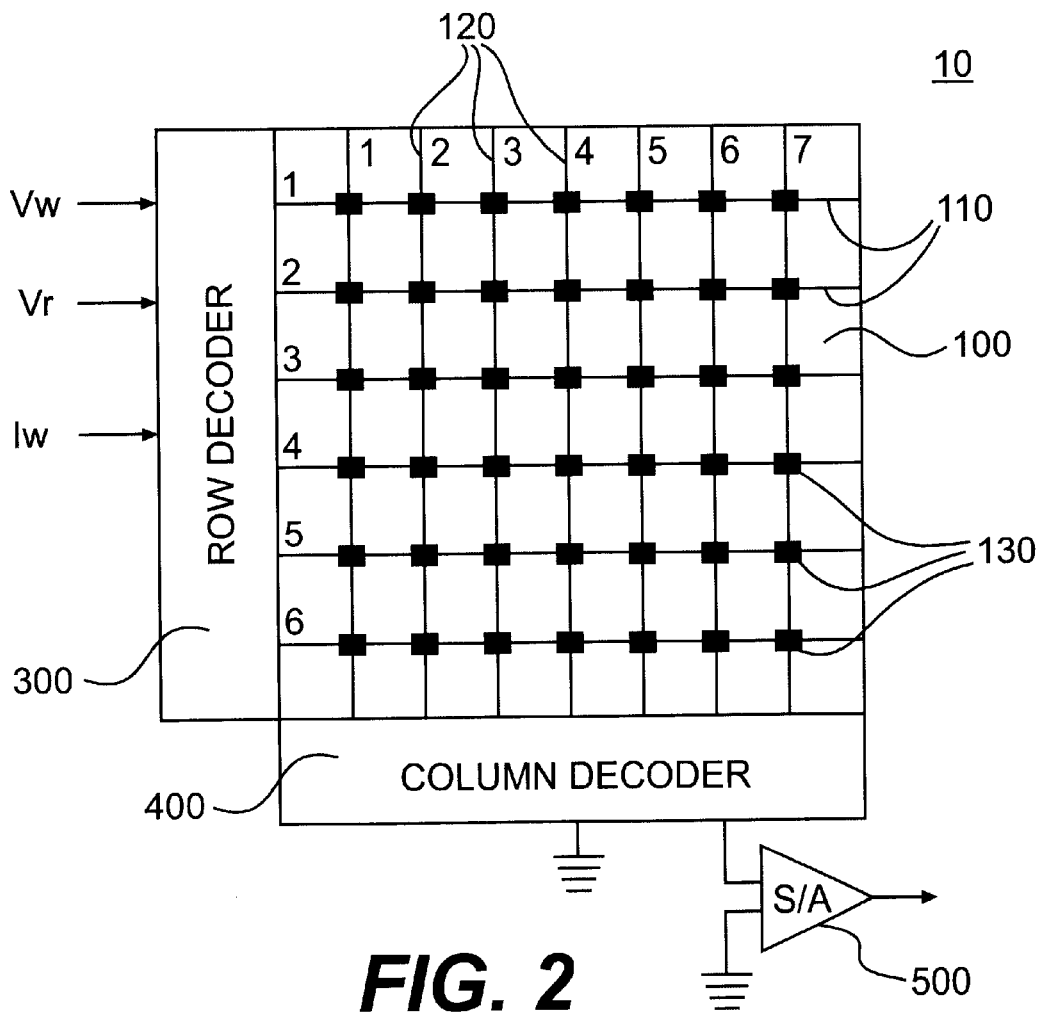
FIG. 2 is a schematic view of a memory device including a memory array as illustrated in FIG. 1 and associated read/write circuitry.

FIG. 2 is a schematic view of a memory device 10 including the memory array 100 as illustrated in FIG. 1, and associated read/write circuitry. The memory device 10 comprises the memory array 100, a row decoder 300 coupled to rows 1–6 of the memory array 100, a column decoder 400 coupled to columns 1–7 of the memory array 100, and a sense amplifier 500 for detecting a binary state of the memory cells 130 during read processes. In FIG. 2, six rows of word lines 110 and seven columns of bit lines 120, intersecting at forty-two memory cells 130, are shown for the purposes of illustration. In practice, arrays of 1024×1024 memory cells and larger, for example, may be used.

The row decoder 300 includes a plurality of switches for selectively applying a write potential Vw or a write current Iw to rows containing a selected memory cell 130 during write processes, or for applying a read potential Vr during read processes. Similarly, the column decoder 400 can include a plurality of switches for coupling selected columns containing selected memory cells 130 to ground during write processes, or for coupling selected columns to the sense amplifier 500 during read processes.

In order to program, or "write to" a selected memory cell 130, the row decoder 300 closes a switch between the write voltage Vw or the write current Iw and the row line 110 in the selected column, and the column decoder 400 closes a switch between ground and the bit line 120 in the selected column. The choice between the write voltage Vw and the write current Iw may depend upon the type of dual tunnel junction memory cells 130 included in the memory array 100. The write voltage Vw or the write current Iw applied to the selected memory cell 130 is sufficient to break down, or "blow" a first tunnel junction of the selected memory cell 130, changing the resistance across the selected memory cell 130. The write voltage Vw or the write current Iw are insufficient to blow the second tunnel junction in the memory cell 130. The second tunnel junction in the programmed memory cell 130 can substantially retain its pre-write resistance, and serves as an isolation element for the programmed memory cell 130. Embodiments of the memory cells 130 and the write process are discussed in detail below.

Figure 3A:
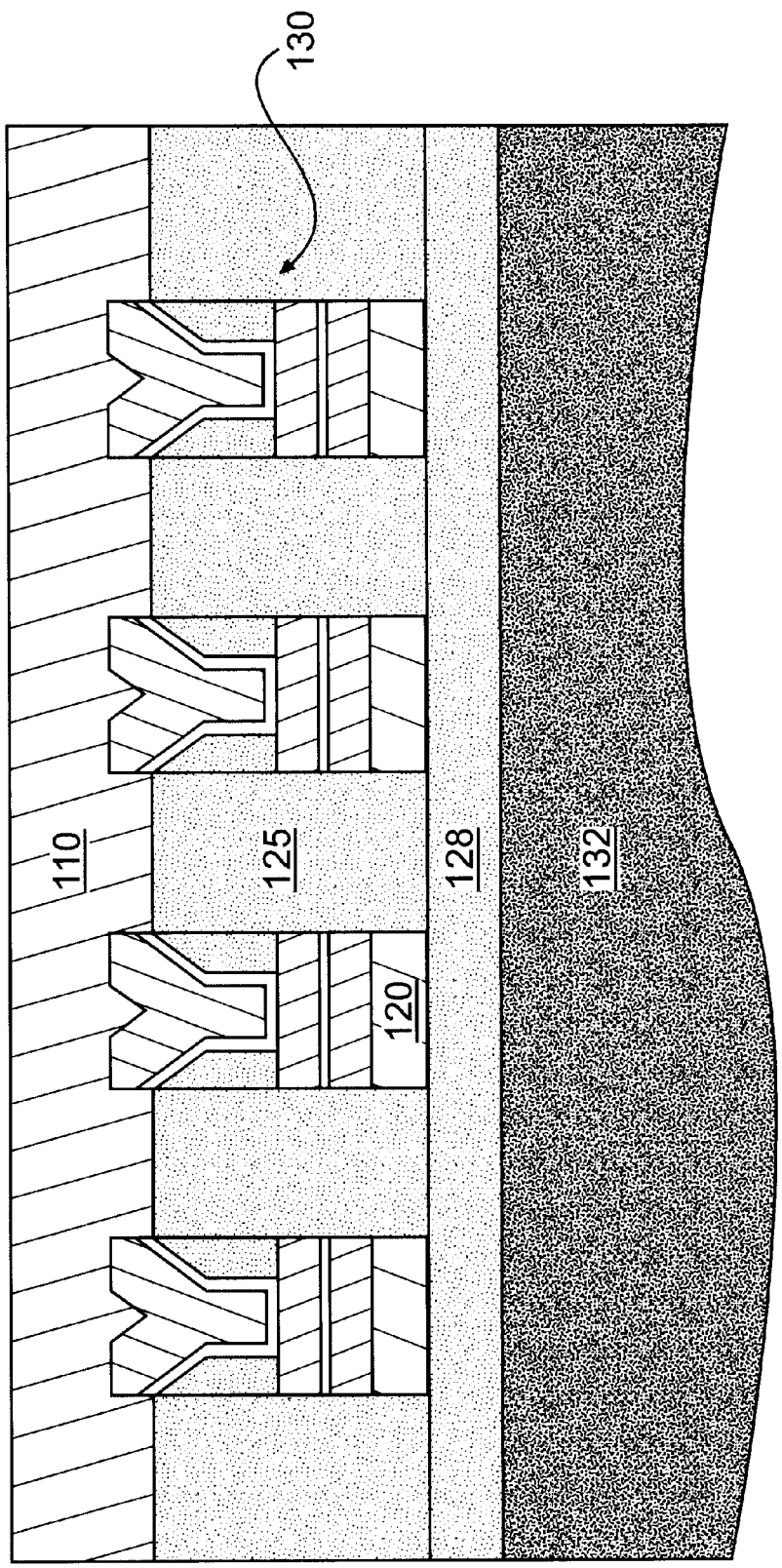
FIG. 3A is a sectional view of a portion of the memory array illustrated in FIG. 1.
Figure 3B:
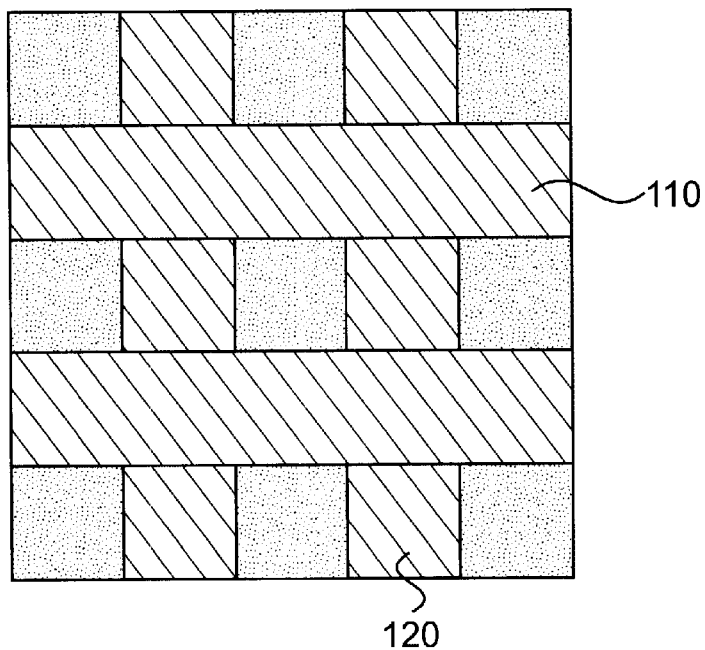
FIG. 3B is a top plan view of the portion of the memory array illustrated in FIG. 3A.
Figure 3C:
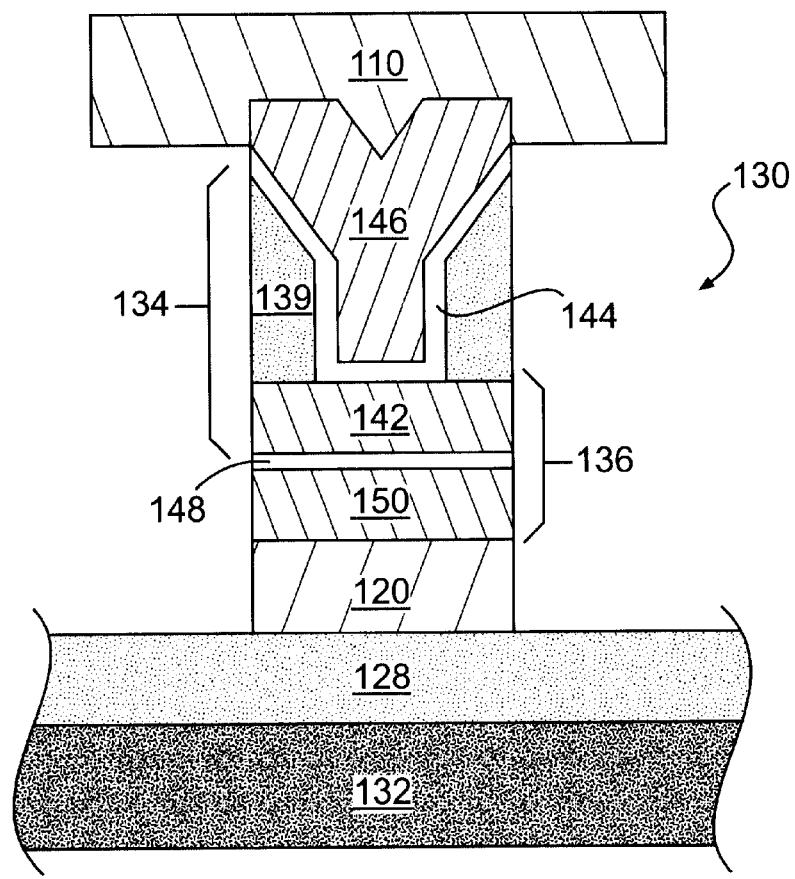
FIG. 3C is an elevational view of an embodiment of a memory cell as illustrated in FIG. 3A.

FIG. 3A is a sectional view illustrating a portion of an embodiment of the memory array 100 illustrated in FIG. 1, including an embodiment of the memory cells 130. FIG. 3B is a top plan view of a portion of the memory array 100. FIG. 3C is an elevational view of a memory cell 130 as illustrated in FIG. 3A.

Referring to FIGS. 3A and 3B, the illustrated portion of the memory array 100 comprises a plurality of memory cells 130 located at cross points of word lines 110 and bit lines 120. The bit lines 120 are disposed over an insulator layer 128 which is disposed over a substrate 132 of the memory array 100. The insulator layer 128 can be, for example $SiO_x$, $SiN_X$, $SiO_XN_Y$, $AlO_X$, $TaO_X$, $TiO_X$, $AlN_X$, and other non-conductive materials. The substrate 132 can be, for example, a semiconductor substrate. The substrate 132 may contain electronic circuitry, and the insulator layer 128 provides isolation between the circuitry and the memory cells 130. Alternatively, the bit lines 120 can be disposed directly over the substrate 132. An insulator 125 is disposed over the insulator layer 128 and between the memory cells 130. The insulator 125 is not shown in FIG. 3B for the purposes of illustration. The insulator 125 can be, for example, $SiO_X$, $SiN_X$, $SiO_XN_Y$, $AlO_X$, $TaO_X$, $TiO_X$, $AlN_X$, and other non-conductive materials.

Referring to FIG. 3C, the memory cell 130 comprises a first tunnel junction 134 and a second tunnel junction 136 in series with the first tunnel junction 134. The first tunnel junction 134 has a different anti-fuse characteristic than the second tunnel junction 136. The memory cell 130 is programmed, or written to, by applying a write current Iw to the memory cell 130 sufficient to break down, or "blow," the first tunnel junction 134, changing the resistance state of the memory cell 130. The resultant, or second resistance state can be a short state for the first tunnel junction 134. The second tunnel junction 136 is designed such that the write current Iw is insufficient to short the second tunnel junction 136 when Iw is applied to the memory cell 130. The second tunnel junction 136 therefore serves an isolation function in the memory cell 130 after the first tunnel junction 134 is blown, obviating the need for active silicon-based isolation elements. The differing anti-fuse characteristics for the first and second tunnel junctions 134, 136 enable the write scheme, and are described below.

The first tunnel junction 134 comprises a first electrode 142, a dielectric 144, and a second electrode 146. The tunneling region of the first tunnel junction 134 is the portion of the dielectric 144 contacting the first electrode 142. The second electrode 146 electrically couples the dielectric 144 to the word line 110. Alternatively, the second electrode 146 can be omitted, and the word line 110 can be directly coupled to the dielectric 144. The dielectric 144 can be made from materials such as, for example, $SiO_X$, $SiN_X$, $SiO_XN_Y$, $AlO_X$, $TaO_X$, $TiO_X$, $AlN_X$, and other dielectric materials. The dielectric 144 can have a thickness on the order of, for example, 0.5 nm to 50 nm. The first and second electrodes 142, 146 can be any conductive material, such as, for example, aluminum, copper, silver, gold, and other conductors. The first tunnel junction 134 also includes a spacer 139. The spacer 139 is used during fabrication of the memory cell 130 to reduce the area of the dielectric 144 contacting the first electrode 142, thereby reducing the tunneling area of the first tunnel junction 130.

The second tunnel junction 136 is in series with the first tunnel junction 134, forming the dual tunnel junction memory cell 130. The second tunnel junction 136 shares the first electrode 142 with the first tunnel junction 134, and also comprises a dielectric 148 and a third electrode 150. The dielectric 148 can be made from materials such as, for example, $SiO_X$, $SiN_X$, $SiO_XN_Y$, $AlO_X$, $TaO_X$, $TiO_X$, $AlN_X$, and other dielectric materials. The dielectric 148 can have a thickness on the order of, for example, 0.5 nm to 50 nm. The third electrode 150 electrically couples the dielectric 148 to the bit line 120. Alternatively, the dielectric 144 can be disposed directly over the bit line 120, and the third electrode 150 can be omitted.

The first tunnel junction 134 is designed to break down before the second tunnel junction 136 when a write current Iw is applied. The breakdown of a tunnel junction is dependent on several factors, including electrode material, dielectric material, the fabrication technique of the dielectric, and the thickness of the dielectric. In general, the resistance across a tunnel junction is inversely proportional to the area of the tunnel junction. In the embodiment illustrated in FIGS. 3A–3C, the area of the tunnel junction 134 across which tunneling occurs is the area of the dielectric 144 between the bottom of the second electrode 146 and the top of the first electrode 142. This area is made relatively small during fabrication of the memory array 100 by forming the spacer 139 before forming the dielectric 144. The area of the second tunnel junction 136 is the area of the dielectric 148 contacting the first and third electrodes 142, 150, and is larger than the tunneling area of the first tunnel junction 134. If the thicknesses and materials of the dielectrics 144, 148 are similar, the first tunnel junction 134 will have a higher resistance $R_1$ than a resistance $R_2$ of the second tunnel junction 136, due to the smaller tunneling area of the first tunnel junction 134.

The breakdown voltage of a tunnel junction is dependent on the thickness and the material used to form dielectric barrier layer of the tunnel junction. In the memory cell 130, the breakdown voltages of the first and second tunnel junctions 134, 136 can be approximately equal.

The write process can be explained with reference to the voltages generated when the write current Iw is applied:

$$V_1 = Iw \cdot R_1$$

$$V_2 = Iw \cdot R_2$$

where:

$V_1$ is the voltage across the first tunnel junction 134;

$V_2$ is the voltage across the second tunnel junction 136;

$R_1$ is the resistance of the first tunnel junction 134; and $R_2$ is the resistance of the second tunnel junction 136.

As shown by the equations for $V_1$ and $V_2$, because the resistance $R_1$ of the first tunnel junction 134 is higher than the resistance $R_2$ of the second tunnel junction 136, the voltage $V_1$ across the first tunnel junction 134 will be higher than $V_2$. Anti-fuse devices are "shorted" by the diffusion of metal or other conductive elements through a dielectric when the tunnel junction is exposed to a potential above its breakdown voltage. The diffusion is driven by the voltage across the anti-fuse. Accordingly, the current flow Iw through the first tunnel junction 134 can result in a voltage $V_1$ that exceeds the breakdown voltage of the first tunnel junction, and a voltage $V_2$ that does not exceed the breakdown voltage of the second tunnel junction 136. Breakdown of the first tunnel junction 134 results in diffusion of conductive elements from the second electrode 146 across the dielectric 144, thereby shorting the first tunnel junction 134. The direction of the write current Iw could also be reversed to cause diffusion of conductive elements from the first electrode 142 across the dielectric 144.

In the embodiment illustrated in FIGS. 3A–3C, the area ratio between the second tunnel junction 136 and the first tunnel junction 134 can be about 1.5:1. If the thickness and materials used to form the dielectrics 144, 148 are similar, the ratio of the resistances $R_1$ and $R_2$ can also be about 1.5:1. Therefore, $V_1$ is 1.5 times or greater than $V_2$, and $V_2$ can be low enough such that no significant change occurs in the second tunnel junction 136 during the write process. The area ratio between the tunnel junctions 136, 134 can be increased to ensure that the first tunnel junction 134 blows before the second tunnel junction 136 is altered during a write process. The area ratio can also be less than 1.5:1, depending upon the application in which the memory cells 130 are used.

Although the dielectric thicknesses are illustrated as equal in FIGS. 3A and 3B, this configuration is not required to obtain the differing anti-fuse characteristics. For example, either of the dielectrics could have a smaller thickness and a dielectric material with high breakdown field (e.g., $Al_2O_3$ has a breakdown field of approximately $2.7 \times 10^{+7}$ V/cm), or a greater thickness and a dielectric material with low breakdown field (e.g., $SiO_2$ has a breakdown field or approximately $0.6 \times 10^{+6}$ V/cm and ZnS has a breakdown field of approximately $1.7 \times 10^{+6}$ V/cm). It is also not required that the breakdown voltages of the tunnel junctions be equal. In the above embodiment, the important design factor is that the write current Iw changes the resistance state of the first tunnel junction 134 from a first state to a second state while the second tunnel junction 136 remains unshorted.

Figure 4A:
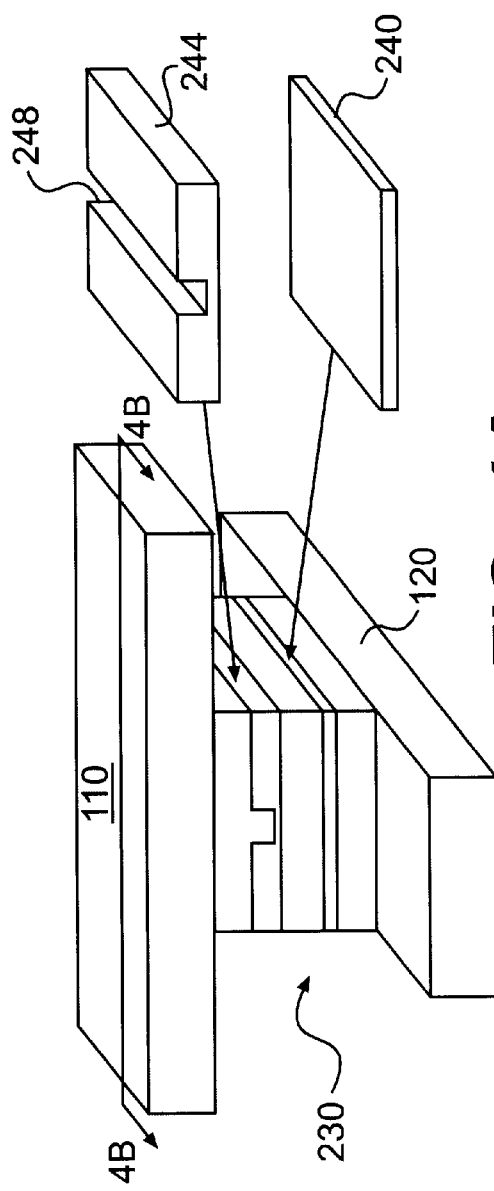
FIG. 4A is a perspective view of an alternative embodiment of a memory cell.
Figure 4B:
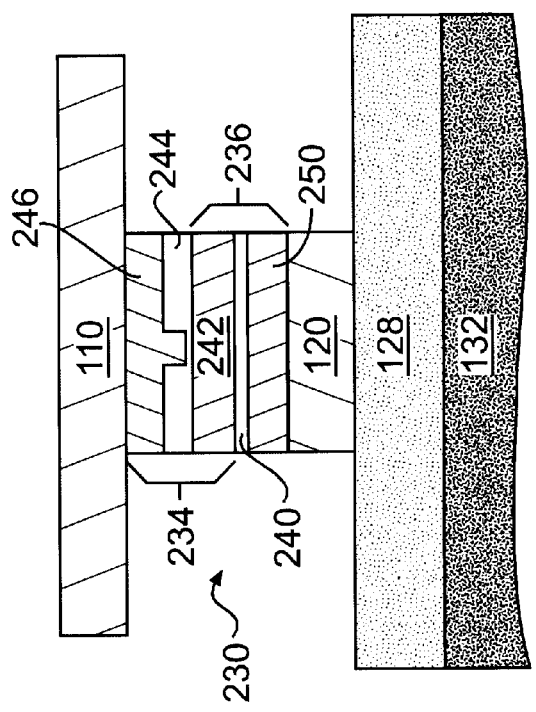
FIG. 4B is a sectional view of the memory cell illustrated in FIG. 4A, taken along line 4B—4B.

FIGS. 4A and 4B illustrate an alternative embodiment of a dual tunnel junction memory cell 230 having tunnel junctions arranged in series. FIG. 4A is a perspective view of the memory cell 230, and FIG. 4B is a sectional view taken on line 4B—4B in FIG. 4A. The memory cells 230 can be utilized in the memory array 100 as illustrated in FIG. 2.

The memory cell 230 comprises a first tunnel junction 234 and a second tunnel junction 236 sandwiched between a word line 110 and a bit line 120. The first tunnel junction 234 has a nonuniform thickness dielectric 244 (shown in exploded form), and has a different anti-fuse characteristic than the second tunnel junction 236. The first tunnel junction 234 comprises a first electrode 242, the dielectric 244, and a second electrode 246. The second tunnel junction 236 shares the first electrode 242 with the first tunnel junction 234, and also comprises a dielectric 240 (shown in exploded form) and a third electrode 250.

As illustrated in FIGS. 4A and 4B, the dielectric 244 has a nonuniform thickness, and includes a feature, or groove 248 extending through the dielectric 244. The tunneling area of the first tunnel junction 234 is essentially equal to the area of the bottom of the groove 248. The groove 248 therefore reduces the breakdown voltage of the first tunnel junction 234. The breakdown voltage of the dielectric 244 can be easily adjusted by changing the thickness of the dielectric 244 below the groove 248 and by varying the material of the dielectric 244.

The memory cell 230 is programmed by applying a write current Iw or a write potential Vw to the memory cell 230. The relatively thin region of the dielectric 244 below the groove 248 is the location of the breakdown of the first tunnel junction 234 when a write current Iw or a write potential Vw is applied, wherein metal from one of the electrodes 242, 244 diffuses across the dielectric 244 below the groove 248. The relatively small tunneling area below the groove 248 provides a localized diffusion region, which results in a small breakdown threshold distribution for the memory cell 230. A small breakdown threshold distribution reduces the probability that an imperfection in the dielectric 244 will cause variability in the breakdown voltage of the first tunnel junction 234. The write current Iw or write voltage Vw used to program the memory cell 230 can therefore be reduced. This feature also reduces the likelihood that the second tunnel junction 236 will be inadvertently altered during a write process.

The thickness and material of the second tunnel junction 236 can be selected so that the resistance of the second tunnel junction 236 can be approximately equal to the resistance of the first tunnel junction 234 (before programming). In this embodiment, the total resistance of the memory cell 130 can be reduced by about half once the first tunnel junction 234 is shorted in the write process.

In FIG. 4B, the second and third electrodes 246, 250 are optional, and the dielectrics may instead be directly coupled to the word and bit lines.

FIGS. 5A, 5B, 6A, 6B, 7, and 8 illustrate alternative embodiments of dielectrics suitable for use in the memory cell 230. Each of the embodiments has a different feature to provide a reduced breakdown voltage and tunneling area.

Figure 5A:
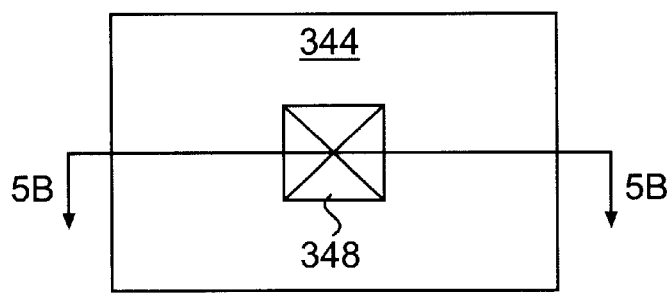
FIG. 5A is a plan view of an embodiment of a dielectric.
Figure 5B:
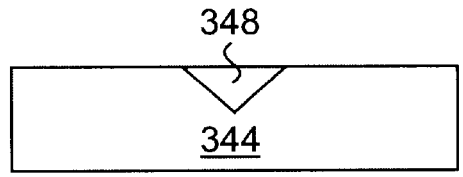
FIG. 5B is a sectional view taken along line 5B—5B in FIG. 5A.
Figure 6A:
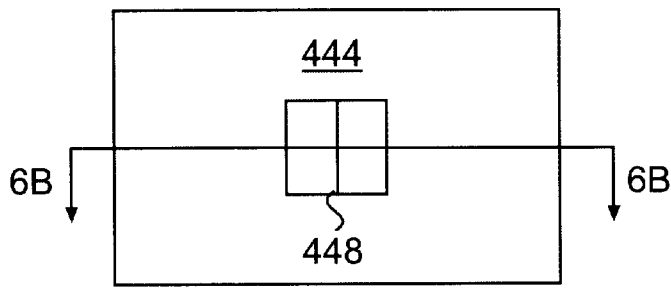
FIG. 6A is a plan view of another alternative embodiment of a dielectric.
Figure 6B:
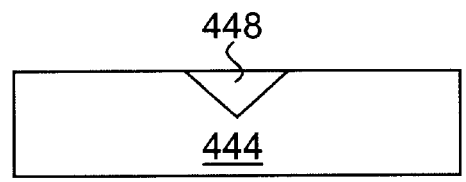
FIG. 6B is a sectional view taken along line 6B—6B in FIG. 6A.
Figure 7:
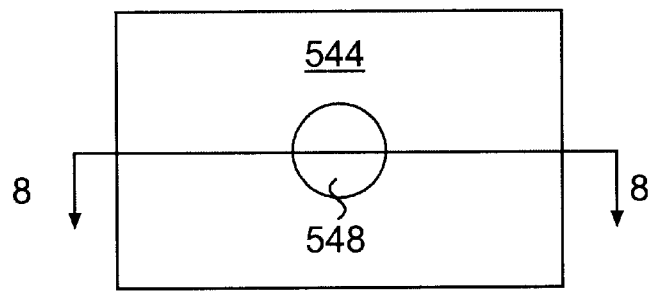
FIG. 7 is a plan view of an another alternative embodiment of a dielectric.
Figure 8:
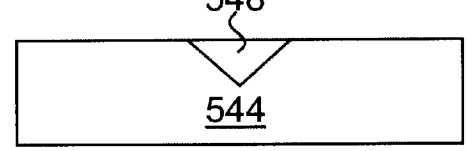
FIG. 8 is a sectional view taken along line 8—8 in FIG. 7.

FIG. 5A illustrates a dielectric 344 having a recess 348 that comes to a point. As shown in FIG. 5B, the recess 348 provides a relatively small thickness at its lowermost point, and a small tunneling area for the dielectric 344. FIGS. 6A and 6B illustrate a dielectric 444 having a recess 448 in the shape of a V-shaped notch. FIGS. 7 and 8 illustrate a dielectric 544 having a recess 548 in the shape of a conical notch. These features all provide a reduced breakdown voltage and a small breakdown threshold distribution. The features 248, 348, 448, 548 illustrated in FIGS. 4–7 can be formed in the dielectrics by, for example, an imprinting process.

It is not necessary to provide a nonuniform dielectric, or to reduce the surface area of a dielectric, in order to obtain a reduced breakdown voltage. A reduced breakdown voltage can also be obtained, for example, using a dielectric of reduced thickness, or by using a dielectric material of low breakdown field, or by combining variations in material and geometry. An alternative embodiment (not illustrated) of a memory cell could include a first tunnel junction having a dielectric of relatively small thickness, and a second tunnel junction having a thicker dielectric. Both dielectrics can have similar shape (e.g., parallelepipedal) and can be made from similar materials. The thinner dielectric in the first tunnel junction 234 provides the differing anti-fuse characteristic (lower breakdown voltage in this embodiment) that allows the first tunnel junction 234 to be blown before the second tunnel junction 236 when a write current or a write voltage Vw is applied.

According to the above embodiments, the memory device 10 does not require active silicon-based isolation elements such as diodes or transistors in order to isolate the memory cells in the memory array 100. The memory device 10 can therefore include stacked memory elements, increasing array density. Tunnel junctions can be made relatively small, which further increases the possible array density for the array 100. In addition, the breakdown voltage of tunnel junctions is easily manipulated by adjusting dielectric thickness, material, and geometry. The write current Iw or write voltage Vw can therefore be reduced by selecting desirable tunnel junction characteristics.

Another advantage to the above embodiments is the small breakdown threshold distribution provided by the dielectrics in the first tunnel junctions. Because of the reduced variability in breakdown voltage for the dielectrics, the distribution of the write voltage Vw or write current Iw (the voltage/current programming distributions) used to program memory cells can be controlled. This aspect reduces the power requirements of the memory device 10, and reduces the chances that an unselected element in the memory device 10 will be inadvertently altered by a write process.

A write process for the memory device 10 will now be discussed with reference to the memory cell embodiment illustrated in FIGS. 2 and 3A–3C. In this embodiment, a write current Iw is applied to program a memory cell 130.

Referring to FIG. 2, in order to write to a selected memory cell 130, a write current Iw is applied to the word line 110 that intersects a selected memory cell 130. The write current Iw may be applied by closing a switch in the row decoder 300 to connect the selected word line 110 to Iw. Switches in the row decoder 300 connected to unselected word lines 110 are open. At the same time, the column decoder 400 connects the bit line 120 intersecting the selected memory cell 130 to ground. The write current Iw therefore flows through the selected word line 110, through the selected memory cell 130, and through the selected bit line 120 to ground. Switches to unselected bit lines 120 are open.

Referring to FIG. 3C, the write current Iw is chosen to generate a voltage $V_1$ across the dielectric 144 sufficient to blow the first tunnel junction 134 in the selected memory cell 130, and a voltage $V_2$ across the dielectric 148 that is insufficient to blow the second tunnel junction 136. The voltage $V_1$ drives diffusion of conductive elements from the second electrode 146 through the dielectric 144, electrically connecting the second electrode 146 (and the bit line 110) to the first electrode 142. The coupling of the second electrode 146 to the first electrode 142 changes the resistance of the memory cell 130 from a first state to a second state, which is detectable by a read process. After the first tunnel junction 134 is blown, the anti-fuse action can reduce the resistance across the first tunnel junction 134 to near zero (i.e., a short). Therefore, after the write process, the resistance across the memory cell 130 is approximated by the resistance across the second tunnel junction 136.

The write process for the embodiments illustrated in FIGS. 4–8 is similar to the above embodiment. The embodiments in FIGS. 4–8 can be programmed by applying a write current Iw or a write voltage Vw. FIG. 2 illustrates an array 100 having memory cells 130, however, memory cells 230 such as the cell shown in FIGS. 4A and 4B can also be utilized in the memory device 10. A write process for programming a memory cell 230 is described below.

Referring to FIGS. 2 and 4B, a selected memory cell 230 is programmed by applying the write voltage Vw or write current Iw to the word line 110 that intersects the selected memory cell 230. The write voltage Vw or write current Iw may be applied by closing a switch in the row decoder 300 to connect the selected word line 110 to Vw or Iw. Switches in the row decoder 300 connected to unselected word lines 110 are open. At the same time, the column decoder 400 connects the bit line 120 intersecting the selected memory cell 230 to ground. The write voltage Vw or write current Iw is therefore applied to the selected memory cell 230. Switches to the remaining bit lines 120 are open.

Referring to FIG. 4B, the write voltage Vw across the selected memory cell is distributed between the first tunnel junction 234 as $V_1$ and the second tunnel junction 236 as $V_2$, where $Vw=V_1+V_2$. The write voltage Vw can be directly applied to the selected memory cell 230, or the write voltage Vw can be the result of the write current Iw applied to the selected memory cell 230. $V_1$ is sufficient to blow the first tunnel junction 234 in the selected memory cell 230, but $V_2$ is insufficient to blow the second tunnel junction 236. The application of the write voltage Vw may be controlled by a current limiting function such that when the first tunnel junction 234 is shorted the second tunnel junction 236 does not experience a significant increase in current. The voltage $V_2$ drives diffusion of conductive elements from the second electrode 246 through the dielectric 244, electrically connecting the second electrode 246 (and the bit line 110) to the first electrode 242. The coupling of the second electrode 246 to the first electrode 242 changes the resistance of the memory cell 230, which is detectable by a read process. After the first tunnel junction 234 is blown, the anti-fuse action can reduce the resistance across the first tunnel junction 234 to near zero (i.e., a short).

An alternative to the above voltage write processes, the row decoder 300 and the column decoder 400 can be responsive to feedback sensors (not illustrated) that sense current flow through a selected memory cell. The feedback sensors can indicate when the first tunnel junction of a selected memory cell is blown, and can cease a write process at that time so that the second tunnel junction is not blown inadvertently.

A read process for the memory device 10 will now be discussed with reference to FIG. 2. The memory device 10 can advantageously employ an equipotential read process, as disclosed in U.S. Pat. No. 6,259,644 to Tran et al., the contents of which are hereby incorporated by reference. An equipotential read process is outlined below with reference to memory cells 130, however the process described is appropriate for a memory device 10 employing the alternative memory cell embodiments described in this specification.

In order to determine a binary state of (i.e., to read) a selected memory cell 130, a read potential Vr is applied to the word line 110 corresponding to the row of the selected memory cell 130, and the bit line 120 corresponding to the column of the selected memory cell 130 is coupled to the sense amplifier 500 through the column decoder 400. An equal potential can be applied to all other bit lines 120 in the memory array 100. The sense amplifier 500 senses the current from the selected bit line 120 to determine the binary state of the selected memory cell 130. The binary state may be detected by a processing device (not shown) coupled to an output from the sense amplifier 500, the output of the sense amplifier 500 indicating the resistance state of the selected memory cell 130. Alternatively, the sense amplifier 500 can include circuitry to determine the binary state, and to output the binary state to a processing device.

The binary state of the selected memory cell 130 can be determined as a change in resistance of the selected memory cell 130 from a high, first value to a low, second value after a write process. For example, a first, high resistance state results in a low current through the memory cell 130, which can represent a binary state of "0." A second, low resistance state (after blowing a first tunnel junction 134) results in a high current through the memory cell 130, and can represent a binary state of "1."

After a write process, a memory cell 130 retains the second tunnel junction 136 in an unshorted state. Therefore, there is no short in the memory array 100 after programming the selected memory cell 130. This isolation function allows a plurality of the cells 130 to be programmed without adversely affecting read and write processes in the memory array 100.

According to the above embodiments, binary states of "1" or "0" can be stored in the memory cells. The first, high resistance state of the memory cells before writing can correspond to a binary state of "0" for the memory cells, and the second, reduced resistance state can correspond to a binary state of"1." This convention, however, is arbitrary, and the assignment of the binary state of "0" can be reassigned to "1," or any other symbolic value.

A method of making the memory array 100 will now be discussed with reference to FIGS. 9–20.

In FIGS. 9–20, the figures having an "A" designation are sectional views along a row of the memory array being fabricated, and the figures having a "B" designation are plan views. FIGS. 9–20 illustrate the fabrication of a memory array 100 having memory cells 130 as illustrated in FIGS. 3A and 3B.

Referring to FIGS. 9A and 9B, the fabrication process begins with providing a substrate 132. The substrate 132 can be, for example, a semiconductor substrate, such as a single crystalline silicon wafer.

A insulator layer 128 is formed over the substrate 132. The insulator layer 128 can be, for example, silicon dioxide deposited by, for example, chemical vapor deposition (CVD), plasma enhanced chemical vapor deposition (PECVD), and other deposition processes. Other suitable materials for the insulator layer 128 include $SiO_X$, $SiN_X$, $SiO_XN_Y$, $AlO_X$, $TaO_X$, $TiO_X$, $AlN_X$, and other dielectric materials. Silicon dioxide can be formed, for example, by depositing a layer of silicon and then oxidizing the silicon.

A first conductive layer 700 is next formed over the insulator layer 128. The first conductive layer will form the bit lines 120. The first conductive layer 700 can be, for example, silver, gold, copper, aluminum, and other metals. The first conductive layer 700 can be formed by, for example, DC or RF sputter deposition processes, and other deposition processes. The first conductive layer 700 can also be, for example, a doped semiconductor layer.

A second conductive layer 702 is formed over the first conductive layer 700. The second conductive layer 702 can be, for example, silver, gold, copper, aluminum, and other metals. The second conductive layer 702 can be deposited by, for example, DC or RF sputter deposition processes, and other deposition processes. The second conductive layer 702 will result in the third electrodes 150 coupling the second tunnel junctions 136 to the bit lines 120, and is therefore optional.

A dielectric layer 704 is formed over the second conductive layer 702. The dielectric layer 704 can be, for example, $SiO_X$, $SiN_X$, $SiO_XN_Y$, $AlO_X$, $TaO_X$, $TiO_X$, $AlN_X$, and other dielectric materials. The dielectric layer 704 can be deposited by, for example, CVD, PECVD, and other deposition processes, and can have a thickness on the order of, for example, 0.5 nm to 50 nm. Silicon dioxide can be formed, for example, by depositing a layer of silicon and then oxidizing the silicon.

A third conductive layer 706 is formed over the dielectric layer 704. The third conductive layer 706 can be, for example, silver, gold, copper, aluminum, and other conductors. The third conductive layer 706 can be deposited by, for example, DC or RF sputter deposition processes, and other deposition processes. After depositing the layers 700, 702, 704, 706, a photoresist mask 708 is placed over the memory array being fabricated.

Referring to FIGS. 10A and 10B, the layers 700, 702, 704, 706 are patterned in an etching process. The etching process results in rows 710. The mask 708 is then removed by an ashing process.

Referring to FIGS. 11A and 11B, the top two conductive layers and the dielectric layer are patterned using a photoresist mask 712. The bottom conductive layers of the rows 710 are not patterned, leaving the bit lines 120. The patterning step results in conductor/dielectric/conductor posts 714 disposed on the bit line 120. The posts 714 correspond to the second tunnel junctions 136. The photoresist mask 712 is then removed by an ashing process, as shown in FIGS. 12A and 12B.

Referring to FIGS. 13A and 13B, an insulator 716 is formed over the memory array being fabricated. The insulator 716 can be, for example, $SiO_X$, $SiN_X$, $SiO_XN_Y$, $AlO_X$, $TaO_X$, $TiO_X$, $AlN_X$, and other insulators. The insulator 716 can be deposited by, for example, CVD, PECVD, and other deposition processes. The surface of the insulator 716 may then be planarized using a process such as, for example, chemical mechanical polishing (CMP).

Referring to FIGS. 14A and 14B, a photoresist mask 718 is placed over the insulator 716, with the area of the insulator 716 over the posts 714 exposed. The insulator 716 over the posts 714 is then etched away.

Referring to FIGS. 15A and 15B, the photoresist mask 718 is removed by an ashing process. A spacer layer 720 is then formed over the array. The spacer layer 720 can be, for example, silicon nitride. The spacer layer 720 can be deposited by, for example, CVD, PECVD, and other deposition processes.

Referring to FIGS. 16A and 16B, the spacer layer 720 is formed into spacers 722. The spacers 722 can be formed by, for example, anisotropic etching. The spacers 722 leave a relatively small exposed surface area over the posts 714.

Referring to FIGS. 17A and 17B, a dielectric layer 724 is formed over the array. The dielectric layer 724 can be, for example, $SiO_X$, $SiN_X$, $SiO_XN_Y$, $AlO_X$, $TaO_X$, $TiO_X$, $AlN_X$, and other dielectric materials. The dielectric layer 724 can be deposited by, for example, CVD, PECVD, and other deposition processes.

A fourth conductive layer 726 is formed over the dielectric layer 724. The fourth conductive layer 726 can be, for example, silver, gold, copper, aluminum, and other metals. The fourth conductive layer 726 can be deposited by, for example, DC or RF sputter deposition processes, and other deposition processes.

Referring to FIGS. 18A and 18B, electrodes 146 are formed by a photolithography/etching process. The photoresist mask can be the mask 718 illustrated in FIG. 14B. The first tunnel junctions have now been formed over the posts 714.

Referring to FIGS. 19A and 19B, the photoresist mask 718 is removed by an ashing process. A fifth conductive layer 730 is then formed over the array. The fifth conductive layer 730 can be, for silver, gold, copper, aluminum, and other conductors. The fifth conductive layer 730 can be formed by, for example, DC or RF sputter deposition processes, and other deposition processes. The fifth conductive layer 730 can also be, for example, a doped semiconductor layer.

Referring to FIGS. 20A and 20B, the fifth conductive layer 730 is patterned into word lines 110 using a photolithography/etching process. A portion of the completed memory array is illustrated in FIGS. 20A and 20B. In FIGS. 20A and 20B, the bit lines 120 may be covered with insulator. The insulator is omitted in FIG. 20B to illustrate the location of the bit lines 120.

An alternative method for fabricating a memory array 100 having the alternative memory cells illustrated in FIGS. 4–8 will now be discussed with reference to FIGS. 9–14 and 21–22.

The above-described process is generally adapted to produce a memory array 100 having memory cells 130 as illustrated in FIGS. 3A–3C. A memory array 100 having cells as illustrated in FIGS. 4–7 requires a different method of fabrication. The method for fabricating such a memory array generally corresponds to the method illustrated in FIGS. 9–14. The methods diverge at this point. The steps of the alternative method, subsequent to the steps illustrated in FIGS. 14A and 14B, are described below.

Referring to FIGS. 21A and 21B, after the area of the insulator 716 over the posts 714 is exposed, as illustrated in FIGS. 14A and 14B, a second dielectric layer 802 is be formed over the array. The dielectric layer 802 can be, for example, $SiO_X$, $SiN_X$, $SiO_XN_Y$, $AlO_X$, $TaO_X$, $TiO_X$, $AlN_X$, and other dielectric materials. Silicon dioxide can be formed by, for example, depositing a layer of silicon and then oxidizing the silicon. The individual dielectrics for each memory cell can then be formed using a photolithography/etching process using a mask similar to the mask 718 illustrated in FIG. 14B.

Referring to FIGS. 22A and 22B, the dielectrics 844 can correspond to any of the dielectrics 244, 344, 444, and 544 illustrated in FIGS. 4–7. The features 248, 348, 448, 548 can be formed in the dielectrics 244, 344, 444, 544 by processes such as, for example, imprinting.

After the selected one of the dielectrics 244, 344, 444, and 544 is formed, a conductive layer (not illustrated) is deposited over the array, and electrodes 246 are patterned over the dielectrics 844 from the conductive layer. The word lines 110 can then be formed over the array as illustrated in FIGS. 19 and 20. Alternatively, a single layer could be deposited to fill the vias down to the dielectrics 844 and to form the word lines 110. The insulator is omitted in FIG. 22B to illustrate the location of the bit lines 120.

The above process yields a memory array having memory cells 230 as illustrated in FIGS. 4A and 4B. Any of the dielectrics 244, 344, 444, 544 can be included in the memory cells 230.

In this specification, the conventions for current flow to write states of "0" and "1" in the memory array are arbitrary, and can be reassigned to fit any desired application of the memory device 10.

The above embodiments are discussed in terms of shorting the first tunnel junction in order to change the resistance of a memory cell from a first, high state to a second, low state. The resistance of a memory cell may also be changed by partially diffusing conductive elements across the first tunnel junction dielectric. This is referred to as a "partial blow." A partial blow of a tunnel junction reduces the resistance across the tunnel junction without shorting the tunnel junction. The diffusion of conductive elements across the dielectric reduces the resistance of the memory cell perceptibly, and the change in resistance can be detected by a read process.

In the present specification, the terms "row" and "column" do not imply a fixed orientation in a memory array. In addition, the terms "row" and "column" do not necessarily imply an orthogonal relationship.

The sense amplifier 500 illustrated in FIG. 2 is an example of a sensing device for detecting a binary state of a the memory cells in the memory device 10. In practice, other sensing devices, such as a trans-impedance sense amplifier, a charge-injection sense amplifier, a differential sense amplifier, or a digital differential sense amplifier, for example, can be used.

One sense amplifier 500 is illustrated in FIG. 3 for sensing the binary state of the memory cells 230. In practice, a greater number of sensing devices can be coupled to a memory array. For example, a sense amplifier can be included for each bit line in a memory array, or, a sense amplifier can be included for every two or more bit lines in a memory array.

The memory array 100 can be used in a wide variety of applications. One application may be a computing device having a storage module. The storage module may include one or more memory arrays 100 for long term storage. The storage module can be used in devices such as laptop computers, personal computers, and servers.

While the memory device 10 is described with reference to exemplary embodiments, many modifications will be readily apparent to those skilled in the art, and the present disclosure is intended to cover variations thereof.

What is claimed is:

1. A memory cell comprising:
   a first tunnel junction; and
   a second tunnel junction in series with the first tunnel junction, wherein the first tunnel junction is changed from a first resistance state to a second resistance state and the first tunnel junction has a different anti-fuse characteristic than the second tunnel junction.

2. The memory cell of claim 1, wherein the second resistance state is a short state.

3. The memory cell of claim 1, wherein the anti-fuse characteristic is a breakdown voltage and the first tunnel junction has a lower breakdown voltage than the second tunnel junction.

4. The memory cell of claim 3, wherein the first tunnel junction comprises a dielectric and wherein the second tunnel junction comprises a dielectric.

5. The memory cell of claim 4, wherein a tunneling area of the first tunnel junction is smaller than a tunneling area of the second tunnel junction.

6. The memory cell of claim 4, wherein the dielectric of the first tunnel junction has a nonuniform thickness.

7. The memory cell of claim 6, wherein the dielectric of the first tunnel junction includes a feature, the feature defining the tunneling area of the first tunnel junction.

8. The memory cell of claim 1, wherein the anti-fuse characteristic is a resistance and the first tunnel junction has a higher resistance than the second tunnel junction before a write process.

9. The memory cell of claim 8, wherein the first tunnel junction comprises a dielectric and wherein the second tunnel junction comprises a dielectric.

10. The memory cell of claim 9, wherein a tunneling area of the first tunnel junction is smaller than a tunneling area of the second tunnel junction.

11. A memory array, comprising:
    an array of memory cells;
    a plurality of word lines coupled to the memory cells; and
    a plurality of bit lines coupled to the memory cells, wherein the word lines cross the bit lines at the memory cells, and wherein a memory cell comprises:
       a first tunnel junction; and
       a second tunnel junction in series with the first tunnel junction, wherein the first tunnel junction is changed from a first resistance state to a second resistance state and the first tunnel junction has a different anti-fuse characteristic than the second tunnel junction.

12. The memory cell of claim 11, wherein the second resistance state is a short state.

13. The memory cell of claim 11, wherein the anti-fuse characteristic is a breakdown voltage and the first tunnel junction has a lower breakdown voltage than the second tunnel junction.

14. The memory cell of claim 13, wherein the first tunnel junction comprises a dielectric and wherein the second tunnel junction comprises a dielectric.

15. The memory cell of claim 14, wherein a tunneling area of the first tunnel junction is smaller than a tunneling area of the second tunnel junction.

16. The memory cell of claim 14, wherein the dielectric of the first tunnel junction has a nonuniform thickness and a feature, the feature defining the tunneling area of the first tunnel junction.

17. The memory cell of claim 11, wherein the anti-fuse characteristic is a resistance and the first tunnel junction has a higher resistance than the second tunnel junction before a write process.

18. The memory cell of claim 17, wherein the first tunnel junction comprises a dielectric and wherein the second tunnel junction comprises a dielectric.

19. The memory cell of claim 18, wherein a tunneling area of the first tunnel junction is smaller than a tunneling area of the second tunnel junction.

* * * * *